(12) United States Patent
Schwyn-Thony et al.

(10) Patent No.: US 10,889,890 B2
(45) Date of Patent: Jan. 12, 2021

(54) VACUUM PROCESSING APPARATUS AND METHOD FOR VACUUM PROCESSING SUBSTRATES

(71) Applicant: Evatec AG, Trubbach (CH)

(72) Inventors: Silvia Schwyn-Thony, Wangs (CH); Romeo Good, Walenstadt (CH); Michael Cheseaux, Klosters (CH); Marco Padrun, Maienfeld (CH)

(73) Assignee: EVATEC AG, Trübbach (CH)

( * ) Notice: Subject to any disclaimer, the term of this patent is extended or adjusted under 35 U.S.C. 154(b) by 198 days.

(21) Appl. No.: 15/758,459

(22) PCT Filed: Sep. 5, 2016

(86) PCT No.: PCT/EP2016/070846
§ 371 (c)(1),
(2) Date: Mar. 8, 2018

(87) PCT Pub. No.: WO2017/042123
PCT Pub. Date: Mar. 16, 2017

(65) Prior Publication Data
US 2018/0245212 A1 Aug. 30, 2018

Related U.S. Application Data

(60) Provisional application No. 62/215,238, filed on Sep. 8, 2015.

(51) Int. Cl.
*C23C 14/35* (2006.01)
*C23C 14/50* (2006.01)
(Continued)

(52) U.S. Cl.
CPC ............ *C23C 14/35* (2013.01); *C23C 14/505* (2013.01); *H01J 37/32715* (2013.01);
(Continued)

(58) Field of Classification Search
CPC .................................................. H01J 37/3452
See application file for complete search history.

(56) References Cited

U.S. PATENT DOCUMENTS

| | | | | |
|---|---|---|---|---|
| 4,746,417 | A | * | 5/1988 | Ferenbach .............. C23C 14/35 204/192.12 |
| 5,182,003 | A | * | 1/1993 | Maass ................. H01J 37/3408 204/298.23 |

(Continued)

FOREIGN PATENT DOCUMENTS

| | | |
|---|---|---|
| DE | 2707144 A1 | 8/1977 |
| EP | 0 443 442 B1 | 9/1996 |

(Continued)

OTHER PUBLICATIONS

Machine Translation to Li (WO 2014/094580) published Jun. 2014.*
International Search Report for PCT/EP2016/070846 dated Dec. 5, 2016.
Written Opinion for PCT/EP2016/070846 dated Dec. 5, 2016.

*Primary Examiner* — John J Brayton
(74) *Attorney, Agent, or Firm* — Pearne & Gordon LLP

(57) ABSTRACT

A vacuum treatment apparatus includes a vacuum treatment recipient with a circular opening between an inside and exterior of the recipient. The recipient houses a turntable, which defines a plane (P) along its table surface, is drivingly rotatable around a central axis perpendicular to plane (P), and exhibits a plurality of circular substrates supports. The opening is arranged such that during a turn of the turntable the area of each of the substrate supports and the opening are fully aligned and completely face each other. The vacuum treatment apparatus also includes a PVD deposition source attached to the opening. The PVD source has a a circular material target and a static magnet arrangement. The magnet arrangement is arranged in a plane (M) in parallel to plane (P) and is not rotationally symmetric around a central axis (Continued)

Figure 1:
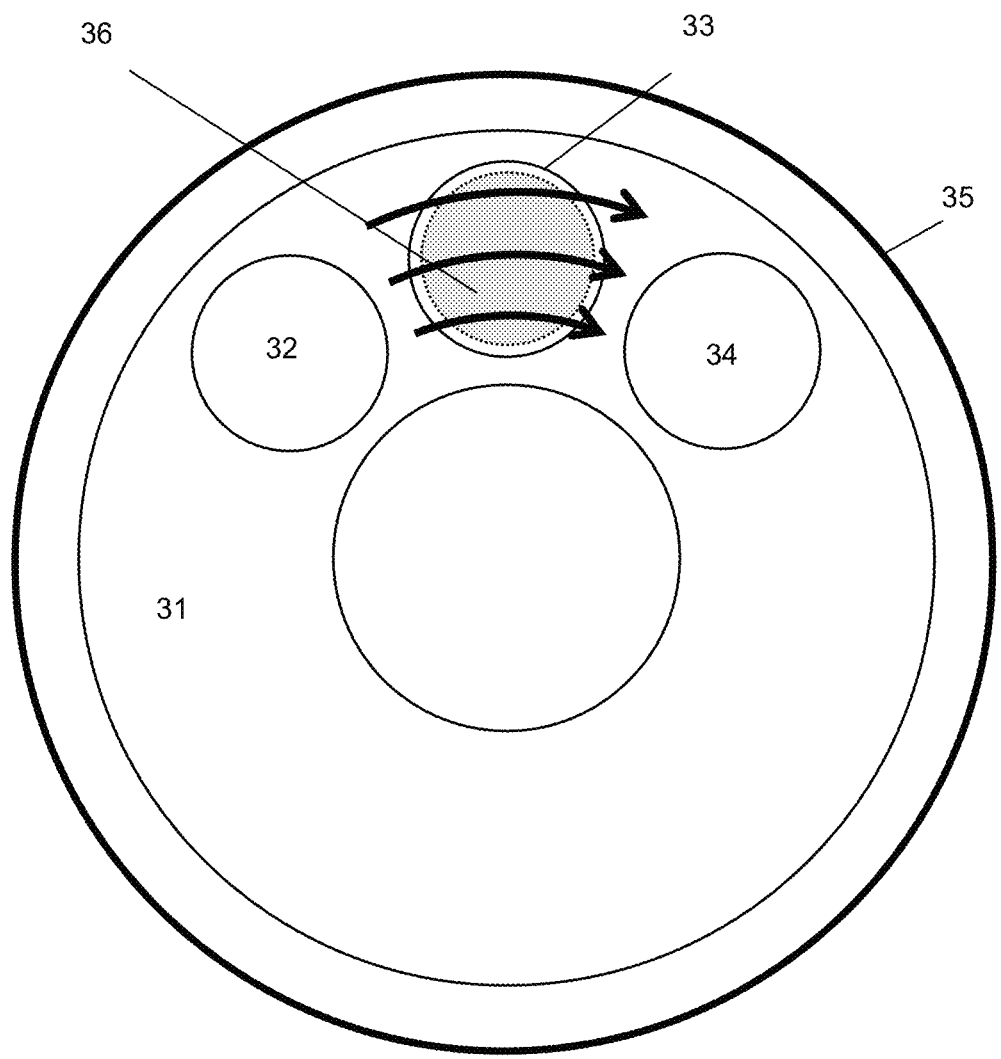

running centrally through the magnet arrangement and being perpendicular to the plane (M).

9 Claims, 4 Drawing Sheets

(51) Int. Cl.
H01J 37/34 (2006.01)
H01J 37/32 (2006.01)
(52) U.S. Cl.
CPC .... H01J 37/32779 (2013.01); H01J 37/3408 (2013.01); H01J 37/3423 (2013.01); H01J 37/3452 (2013.01)

(56) References Cited

U.S. PATENT DOCUMENTS

| | | | |
|---|---|---|---|
| 6,183,614 B1 | 2/2001 | Fu | |
| 7,799,190 B2 * | 9/2010 | Mullapudi | H01J 37/3497 204/298.09 |
| 2006/0076230 A1 * | 4/2006 | Murphy | C23C 14/35 204/192.12 |

FOREIGN PATENT DOCUMENTS

| | | | |
|---|---|---|---|
| JP | 11-140639 A | | 5/1999 |
| WO | WO 2014/094580 | * | 6/2014 |

* cited by examiner

VACUUM PROCESSING APPARATUS AND METHOD FOR VACUUM PROCESSING SUBSTRATES

This invention relates to a system or apparatus for processing substrates under sub-atmospheric conditions, especially semiconductor wafers or substrates predominantly consisting of glass or plastics. Further, a method for manufacturing such substrates is described.

DEFINITIONS

Processing in the sense of this invention means a treatment step or a sequence of treatment steps for a substrate. A vacuum treatment means a vacuum process in which a workpiece is surface treated under pressures below atmospheric pressure or under vacuum conditions, respectively. Treatment includes any chemical, physical effect on the surface, such as PVD, CVD coatings, etching, thermal annealing, or alike.

Substrates or workpieces in the sense of this invention are components or parts to be treated in a processing apparatus. Substrates include but are not limited to flat, plate shaped parts having rectangular, square or circular shape. In a preferred embodiment this invention refers to essentially planar, circular substrates, e.g. predominantly consisting of silicon (wafer), glass or plastics.

A vacuum processing or vacuum treatment system or apparatus comprises at least an enclosure for substrates to be treated under pressures lower than ambient atmospheric pressure.

A processing station means a region of a vacuum treatment system dedicated to perform a treatment step (in contrast to load/unload operations or transport under vacuum) CVD or Chemical Vapour Deposition is a chemical process allowing for the deposition of layers on heated substrates. One or more volatile precursor material(s) are being fed to a process system where they react and/or decompose on the substrate surface to produce the desired deposit.

Physical vapor deposition (PVD) is a general term used to describe any of a variety of methods to deposit thin films by the condensation of a vaporized form of a material onto a surface of a substrate. The coating method involves purely physical processes such as high temperature vacuum evaporation or plasma sputter bombardment in contrast to CVD. Variants of PVD include Cathodic Arc Deposition, Electron beam physical vapor deposition, Evaporative deposition, Sputter deposition (i.e. a glow plasma discharge usually confined in a magnetic tunnel located on a surface of a target material).

The PVD process of sputtering, also called cathode sputtering, means that atoms are ablated from the surface of a so-called target by bombardment with high-energy ions, go over into the gas phase and are finally deposited on the surface of the substrate. An electric field between the target and a counter electrode maintains an ionization process of a supplied working gas in this area. The ions from the gas accelerate towards the target and cause the atomization of the solid body's surface. The characteristics of this sputtering process can be influenced and amplified by magnetic means positioned behind the target (away from the substrate). Such magnet systems are known in the art to be arranged in a way to generate a closed magnetic tunnel-loop spanning over the surface of the target. This tunnel confines predominantly electrons which intensify the impact ionization process with the working gas. This arrangement is known as magnetron sputtering apparatus or magnetron. In order to improve target erosion over time and deposition homogeneity, the magnet systems are often being rotated around an axis perpendicular to the target surface.

The working gas used in sputtering apparatus' are noble gases such as Argon which may be supplemented by reactive gases like hydrogen, nitrogen, oxygen, etc. (or mixtures thereof). The sputtered particles from the target may then react with the gases and the deposited layer comprises the oxides, nitrides, oxynitrides, . . . of the target material.

The terms layer, coating, deposit and film are interchangeably used in this disclosure for a film deposited in vacuum processing equipment, be it CVD, LPCVD, plasma enhanced CVD (PECVD) or PVD (physical vapour deposition)

Vacuum sputter apparatus are well known in the art and include variants such as batch-type processing systems or single-substrate treatment systems. Vacuum processing systems with many different processing stations allow for treating substrates without breaking vacuum between processing steps. Introducing or removing a substrate into or from such a controlled vacuum environment usually utilizes a load/unload lock, which is also well known in the art.

TECHNICAL BACKGROUND

This invention relates to a type of vacuum processing systems which includes a rotatable turntable in a vacuum enclosure. This turntable exhibits a number of positions for substrates to be arranged at. The number of possible substrates is determined by the size of the turntable vs. the size (radius) and shape of the substrates. The processing stations are commonly attached to vacuum sealable openings in the enclosure through which the intended treatment for the substrates takes place. During processing the turntable may rotate in a continuous or discontinuous procedure. Both modes of operation have their specifics. In a discontinuous procedure a substrate is moved in front of a processing station and is being treated while the turntable is motionless. The treatment source will be activated as soon as the substrate is correctly placed. Achieving a homogeneous treatment result is hereby simplified. However, turning the treatment source on and off and moving the substrate between treatments is basically unproductive time. In a continuous procedure the substrate is being treated while it is passing along the process station. This approach is known from so-called inline coating systems, which are widely known in the art, e.g. for coating architectural glass. The process station, e.g. a sputtering source may remain in operation while substrates pass by.

DRAWBACKS IN PRIOR ART

While it seems obvious to combine the advantages of a rotating substrate table (compactness) with the passing-by approach of inline-systems (ease of operation), it has one unavoidable systematic problem. FIG. 1 shows the top view on a circular turntable 31 within an enclosure 35. Only 3 substrate positions 32, 33, 34 are indicated. While in operation the turntable rotates and thus substrates are treated by e.g. a coating source indicated by area 36. As one will easily comprehend, the substrates will not be coated homogeneously per area, but depending on both their position relative to the rotating axis and on the substrate. Substrate source 36 is being shown as circular, but the underlying effect would also apply to a source that has a more extended form, i.e. a radially extended line source.

EP 0 443 442 shows an apparatus and application which deals with a.m. problem. By not only rotating the turntable but also the substrates, over time the deposition uniformity is equalized. However, the turntable has to be equipped with means to allow for individual substrate rotation. It can be resolved mechanically (e.g. by gears) or with an electrical drive which however again necessitates a power line to the turntable. Rotating substrates again create an own set of problems, because clamping substrates to them and cooling requires more constructive and maintenance efforts.

It is therefore the objective of the invention to provide a vacuum processing apparatus and a method for vacuum processing substrates which avoids the necessity of substrate rotation and does not require a rotating magnet system in the magnetron, but a static one.

SHORT DESCRIPTION OF THE FIGURES

FIG. 1: Illustration of the systematic problem of "turntable" vacuum treatment systems
FIG. 2: Basic design of a magnet system used in the present invention
FIG. 3: top view and cross section of vacuum coating system with turntable
FIG. 4: Detail of a magnet system as used in the present invention

SUMMARY OF THE INVENTION

Figure 3:
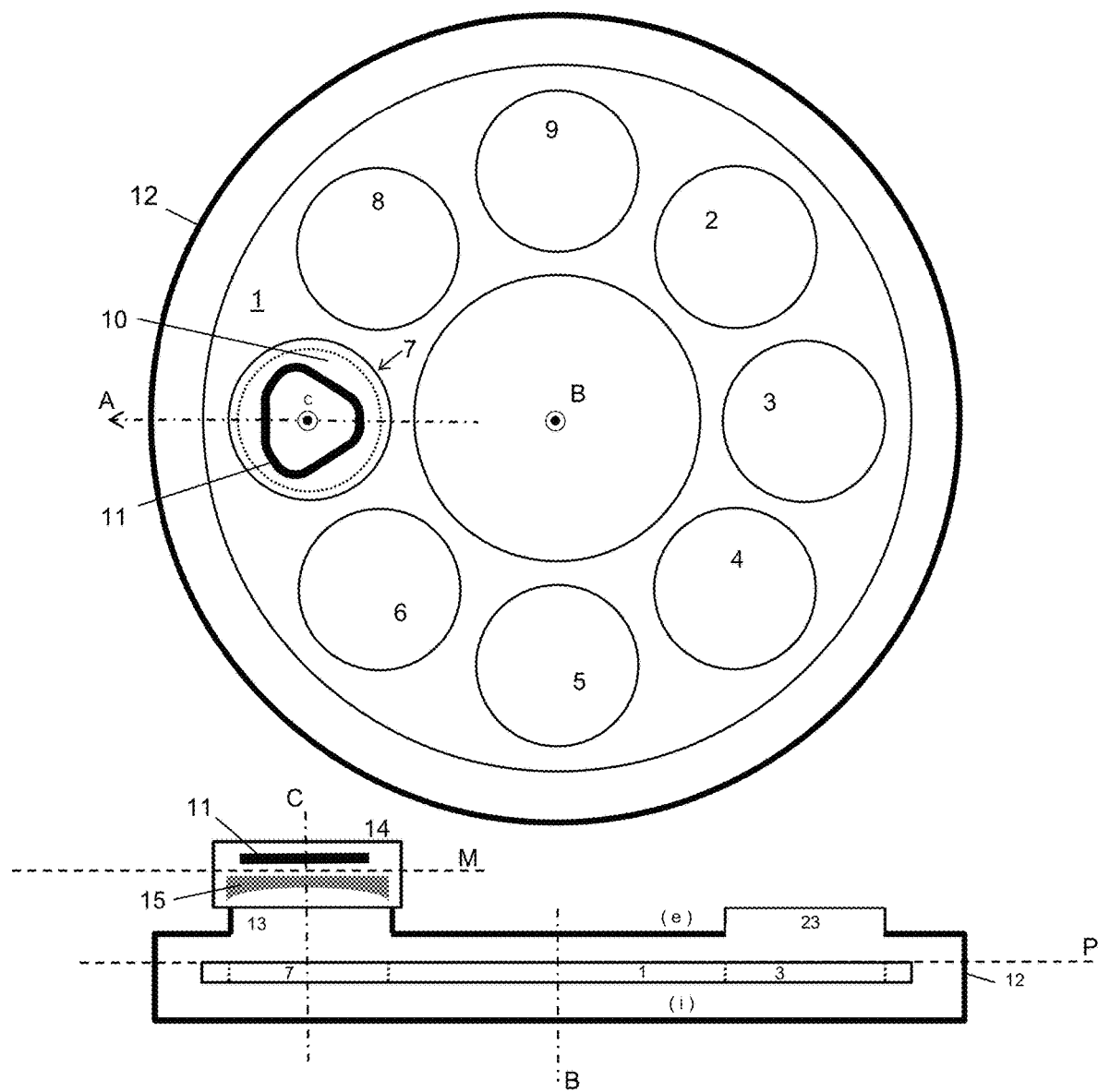
Figure 4:
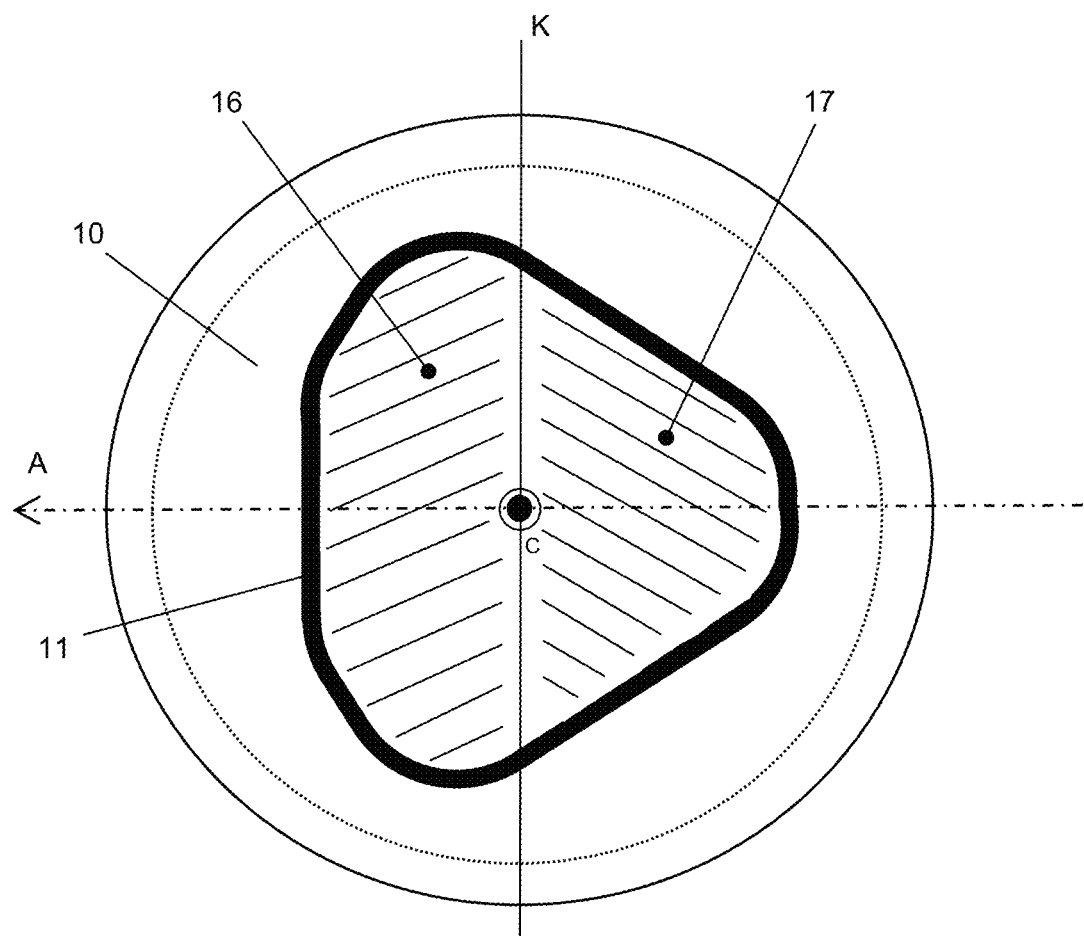

A vacuum treatment apparatus according to the invention is shown in FIG. 3 and comprises a vacuum treatment recipient 12 with at least one sealable, circular opening 13 between an inside (i) and exterior (e) of said recipient 12, said recipient again housing a turntable 1, which (a) defines a plane P along its table surface, is (b) drivingly rotatable around a central axis B perpendicular to plane P and exhibits (c) a plurality of circular substrate supports or substrate positions 2, . . . 9. The opening 13 is arranged such that during a turn of the turntable 1 the area of each of the substrate supports 2, . . . 9 and the opening 13 are fully aligned and completely face each other. A PVD deposition source 14 is attached to said at least one opening 13, wherein said PVD source exhibits at least a circular material target 15 and a static magnet arrangement 11, said magnet arrangement 11 being arranged in a plane M in parallel to plane P and not being rotational symmetric around a central axis C, which is running centrally through said magnet arrangement and perpendicular to said plane M. In a preferred embodiment the magnet system 11 is symmetric around a symmetry axis A in the plane M.

In a further preferred embodiment the magnet arrangement (11) is asymmetric around any symmetry axis (A) in the plane (M).

In a further embodiment said magnet arrangement (11) comprises two closed loops of magnets with identical polarity per loop and opposite polarity between both loops, one loop surrounding the other, whereby an outer closed loop and an inner closed loop is formed, wherein at least the outer loop is surrounding central axis (C) and both loops of magnets are asymmetric around any symmetry axis (A) in the plane (M).

In a further embodiment each loop of the magnet system (11) comprises at least 4 sectors, wherein two sectors form a circular arc around the central axis (C) of the magnet arrangement, and one sector between a first pair of opposing ends of the circular arc sectors comprises or forms a straight line, and one sector between a second pair of opposing ends of the circular arc sectors comprises or forms a line inwardly bound towards or around the central axis (C) of the magnet arrangement. Whereby straight line(s) and bound line(s) do not cross each other. Circular arc sectors can be too bound inwardly round central axis (C).

In a further embodiment one circular arc sector forms an innermost sector of the magnet system with reference to central axis (B) of the turntable and one circular arc sector forms an outermost sector of the magnet system with reference to central axis (B) of the turntable.

At least one circular arc sector can be symmetric with reference to a symmetry axis (A) intersecting turntable's central axis (B).

It is hereby stated explicitly that despite of the fact that the invention is illustrated on the basis of different examples it is understood that any combination of the examples or certain features of one example with another example or parts of another example are supposed to be disclosed as being part of the actual invention, as long as such combination cannot be clearly recognized as a nonsensical measure by the man of the art.

DETAILED DESCRIPTION OF THE INVENTION

The vacuum processing system shall be described with reference to FIG. 3. FIG. 3 shows both a top view and a cross section through a simplified representation of the inventive system. An enclosure or vacuum treatment recipient 12 has at least one, preferably a plurality of sealable openings 13, 23. They are provided to accept process stations such as e.g. a PVD deposition source 14, load locks, heating stations, or degasser depending on what treatments are required. Inside the recipient 12 there is an essentially circular turntable 1 exhibiting locations for substrates or substrate supports 2-9. The turntable's general surface also defines a plane P. The substrate supports 2-9 can be recesses matching the outer shape of the substrate to be treated; simple rims, pins, chucks, holders, clamps or mounts. In case substrates are being held by carriers, the mount could be a support for such a carrier.

Supports 2-9 are shown as of circular shape, this shall however not be a limiting factor for the shape of the substrate.

The turntable has a rotational axis B. A drive able to turn the turntable has been omitted in FIG. 3. A man skilled in the art will choose an appropriate solution.

The number and shape of the substrate supports will be defined by geometrical constraints as well the specifications for the vacuum processing system.

Exemplarily, one PVD deposition source 14 is shown arranged on opening 13. PVD source 14 essentially comprises a circular material target 15 and a static magnet arrangement 11. The magnet arrangement defines a plane M which is parallel to plane P and, accordingly, perpendicular to axis B. A further axis C is the central axis through the circular target and is perpendicular to plane M and consequently parallel to axis B. This axis C also marks the centre of opening 13, 23 respectively. The radial distance between axis B and C is chosen the same as between axis B and the centre of each substrate support 2 . . . 9. In other words, during each turn of the turntable the area of each of the substrates supports and openings 13, 23 are fully aligned and completely face each other at least for the split of the second when the condition is met. The number of openings may match the number of substrate locations, but it is not mandatory.

The PVD source exhibits a static magnet system 11 designed in a way to compensate the deposition inhomogeneity caused by the rotational movement of a substrate passing by underneath. It is further designed in such a way to do without screens, shapers or shades. Such elements are often used to block certain portions of the path between target and substrate. In this regard the PVD source described herein is designed such that no obstructive physical elements are introduced in the volume between target and substrate with the purpose of deliberately accepting target material before it could hit the substrate. This volume shall be defined and limited by the connecting lines between target rim and substrate rim in the moment of mutual alignment. In other words, between any spot on the target and any spot on the substrate an unblocked line of sight exists (again, in the moment of mutual alignment). The lack of shapers or shades eliminates an important source of flaking; moreover the utilization of target material is improved.

Figure 2:
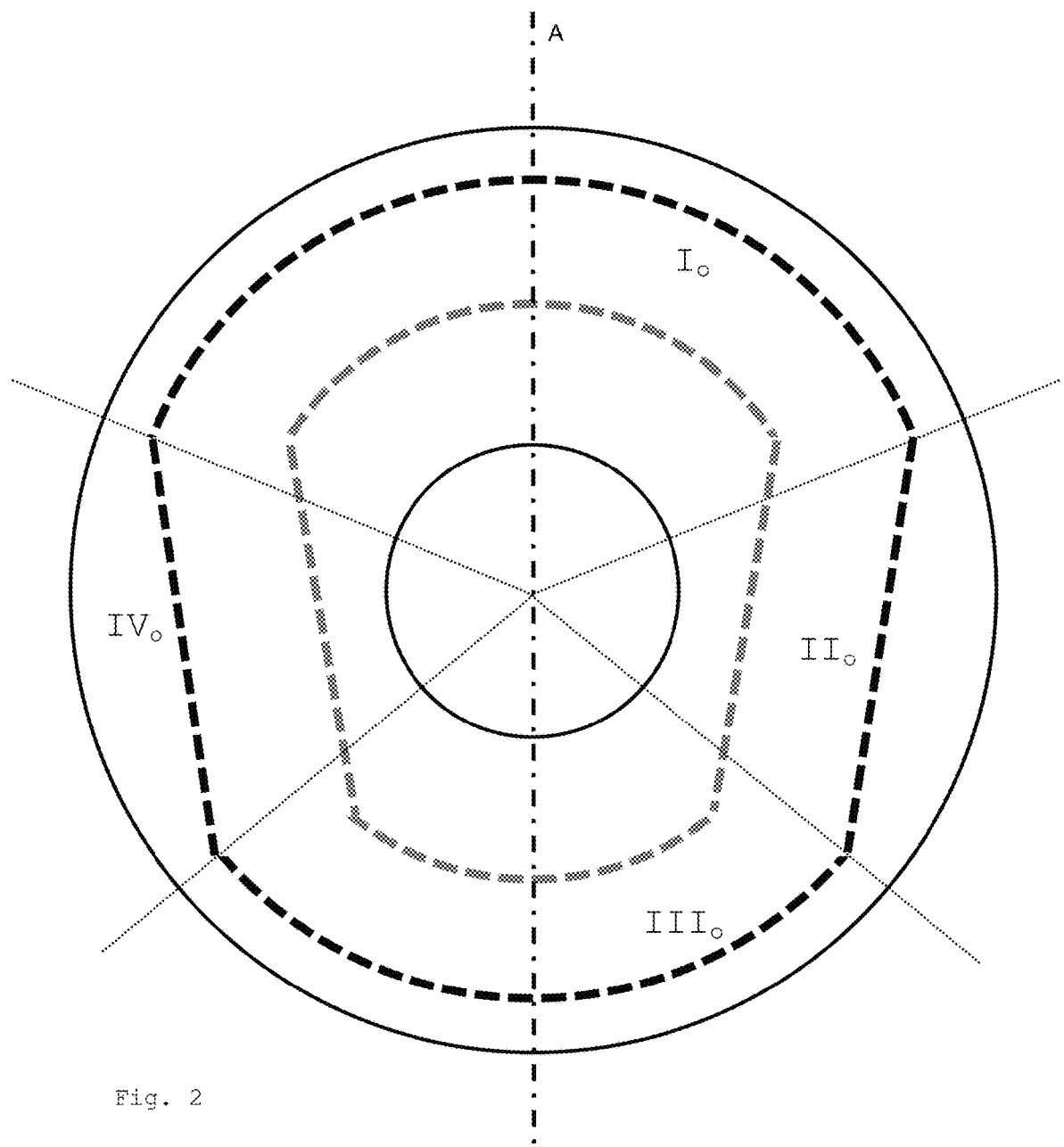

The magnet system capable of achieving this objective has in a preferred embodiment a basic form as described in FIG. 2, which is a top view. Essentially it includes two rings of magnets, one encircling the other and with opposite polarity. They are shown in FIG. 2 as dashed lines and during operation the plasma tunnel essentially is trapped between the magnetic arches generated by those two magnet rings. Surprisingly the inventors have found that in a preferred embodiment the two magnet loops basically exhibit the shape of a trapeze. In a simplified form it can be described as comprising at least 4 sectors, wherein two sectors form a straight line and two sectors form a circular arc. Roman letters I-IV show these sectors in FIG. 2. The index o indicates the "outer" ring of magnets for which the dotted separation lines are valid. The inner ring may have its own angular distribution of sectors, but follows the basic recipe described above. The transition zone between two sectors may exhibit curved sections to smoothen the bend for the plasma loop during operation. In a variant, the layout of this magnet system is symmetric around axis A lying in plane M. In a further preferred embodiment of this variant the axis A intersects axis B and extends thus radially from the central axis B of the vacuum system or turntable, respectively.

A further inventive feature is described in FIG. 4, which again shows a portion of FIG. 3. The same figures mean the same technical components. The magnet system 11 in top view is shown with symmetry axis A and a line K. This line K intersects axis C and lies within plane M, it basically separates the area 10 in halves. Consequently the area bordered by magnet system 11 is also separated in an area 17 lying radially closer to the axis B than area 16, which extends away from the centre (indicated by the arrow at axis A). According to the invention, area 16 has to be chosen larger than area 17 in order to allow for homogeneous coating of the substrates and to compensate for systematic inhomogeneity induced by the substrate when passing on its curved arc-path underneath a coating source 14. For the purpose of the invention the border for areas 16, 17 may be chosen by the line defined by outer or inner magnet loop.

It has been shown, that a coating homogeneity of less than 1% can be achieved on the equivalent substrate area of a 6" wafer for a $SiO_2$ target, with a treatment system as described above incl. a static magnet system, the substrates being static on the continuously rotating turntable. Homogeneities of 1.3% have been achieved for $Nb_2O_5$ and of 2.3% for SiN under equivalent conditions.

Even better performance can be achieved when the substrate is being rotated with a substrate-rotating mechanism. For even larger areas than 6" performances of under 1% can be achieved.

What is claimed is:

1. A vacuum treatment apparatus comprising
a vacuum treatment recipient with at least one sealable, circular opening between an inside and exterior of said recipient, said recipient housing a turntable, which
defines a first plane along a table surface of the turntable;
is drivingly rotatable around a central axis of the turntable perpendicular to the first plane
and exhibits a plurality of circular substrate supports;
said at least one opening being arranged such that during a turn of the turntable the area of each of the substrate supports and the opening are fully aligned and completely face each other;
a PVD deposition source attached to said at least one opening
said PVD source exhibiting at least a circular material target and a static magnet arrangement, said magnet arrangement
being arranged in a second plane in parallel to the first plane;
not being rotational symmetric around a central axis of the magnetic arrangement running centrally through said magnet arrangement and being perpendicular to said second plane;
being asymmetric around any symmetry axis in the second plane; and
comprising two closed loops of magnets with identical polarity per loop and opposite polarity between both loops, one loop surrounding the other, forming an outer loop and an inner loop, wherein the outer loop is surrounding the central axis of the magnetic arrangement and both loops of magnets are asymmetric around any symmetry axis in the second plane.

2. A vacuum treatment apparatus according to claim 1, wherein an area bordered by said magnet arrangement can be separated along a line in the second plane intersecting perpendicularly the central axis of the magnetic arrangement into a first area oriented away from a center of the turntable and a second area towards the center of the turntable wherein the first area is larger than the second area.

3. The apparatus of claim 1, wherein no screens, shapers or shades are required to improve the deposition homogeneity of the PVD deposition source.

4. The apparatus of claim 1, wherein both of the two closed loops of magnets surrounds the central axis of the magnetic arrangement.

5. The apparatus of claim 1, wherein each loop of the magnet arrangement comprises at least 4 sectors, wherein two sectors form a straight line and two sectors form a circular arc.

6. The apparatus of claim 1, wherein each loop of the magnet arrangement comprises at least 4 sectors, wherein two sectors form a circular arc around the central axis of the magnet arrangement, and one sector between a first pair of opposing ends of the circular arc sectors comprises or forms a straight line, and one sector between a second pair of opposing ends of the circular arc sectors comprises or forms a line inwardly bound towards or around the central axis of the magnet arrangement.

7. The apparatus of claim 6, wherein one circular arc sector forms an innermost sector of the magnet arrangement with reference to the central axis of the turntable and one circular arc sector forms an outermost sector of the magnet arrangement with reference to the central axis of the turntable.

8. The apparatus of claim 7, wherein at least one circular arc sector is symmetric with reference to a symmetry axis intersecting the central axis of the turntable.

9. Method for treating substrates in a vacuum treatment apparatus according to claim 1, the method comprising loading at least one substrate into said vacuum treatment apparatus onto at least one of said substrate supports and rotating the turntable around the central axis of the turntable in an continuous, uninterrupted movement at least while sputter depositing material from PVD source onto said at least one substrate.

* * * * *